US008222076B2

(12) United States Patent
Wu et al.

(10) Patent No.: US 8,222,076 B2
(45) Date of Patent: Jul. 17, 2012

(54) FABRICATING AMORPHOUS ZINC OXIDE SEMICONDUCTOR LAYER

(75) Inventors: Yiliang Wu, Mississauga (CA); Yuning Li, Mississauga (CA); Beng S. Ong, Mississauga (CA)

(73) Assignee: Xerox Corporation, Norwalk, CT (US)

( * ) Notice: Subject to any disclaimer, the term of this patent is extended or adjusted under 35 U.S.C. 154(b) by 469 days.

(21) Appl. No.: 11/498,031

(22) Filed: Aug. 2, 2006

(65) Prior Publication Data

US 2008/0032444 A1 Feb. 7, 2008

(51) Int. Cl.
*H01L 21/16* (2006.01)
(52) U.S. Cl. ........ 438/104; 438/142; 438/201; 438/206; 438/209; 438/241; 257/E21.411
(58) Field of Classification Search .................. 438/142, 438/201, 206, 209, 241
See application file for complete search history.

(56) References Cited

U.S. PATENT DOCUMENTS

| | | | |
|---|---|---|---|
| 2005/0150773 A1* | 7/2005 | Yamada et al. | 205/199 |
| 2005/0199881 A1* | 9/2005 | Hoffman et al. | 257/72 |
| 2006/0244107 A1* | 11/2006 | Sugihara et al. | 257/646 |
| 2006/0286737 A1* | 12/2006 | Levy et al. | 438/199 |
| 2008/0024752 A1* | 1/2008 | Ng et al. | 355/132 |

OTHER PUBLICATIONS

Ohya et al, Fabrication of Zinc oxid Transparent Thin Film Transistor with ZrO2 insulating layer by Sol-Gel Method, Apr. 8, 2005 pp. 1919-1922.*
E. Fortunato et al., "Fully Transparent ZnO Thin-Film Transistor Produced at Room Temperature," *Adv. Mater.*, vol. 17, No. 5, pp. 590-594 (Mar. 8, 2005).
B. J. Norris et al., "Spin coated zinc oxide transparent transistors," *J. Phys. D: Appl. Phys.*, vol. 36, pp. L105-L107 (2003).
B. Sun et al., "Solution-Processed Zinc Oxide Field-Effect Transistors Based on Self-Assembly of Colloidal Nanorods," *Nano Lett.*, vol. 5, No. 12, pp. 2408-2413 (2005).

* cited by examiner

*Primary Examiner* — Matthew Reames
*Assistant Examiner* — Elias M Ullah
(74) *Attorney, Agent, or Firm* — Fay Sharpe LLP

(57) ABSTRACT

A process for fabricating a semiconductor layer of an electronic device including: liquid depositing one or more zinc oxide precursor compositions and forming at least one semiconductor layer of the electronic device comprising predominately amorphous zinc oxide from the liquid deposited one or more zinc oxide precursor compositions.

15 Claims, 3 Drawing Sheets

FABRICATING AMORPHOUS ZINC OXIDE SEMICONDUCTOR LAYER

CROSS-REFERENCE TO RELATED APPLICATIONS

Beng S. Ong et al., U.S. application Ser. No. 11/450,998, filed Jun. 12, 2006, titled FABRICATION PROCESS FOR CRYSTALLINE ZINC OXIDE SEMICONDUCTOR LAYER, the disclosure of which is totally incorporated herein by reference.

BACKGROUND OF THE INVENTION

Zinc oxide is a promising channel semiconductor in thin film transistors ("TFTs") for fabricating low cost TFT circuits for large area displays and other low cost electronics. But conventional processes for making zinc oxide semiconductor layers can be costly, involving high equipment investment and complex processing techniques. Thus, there is a need addressed by embodiments of the present invention for simpler, less costly fabrication processes, particularly at a plastic substrate compatible temperature.

The following documents provide background information:

E. Fortunato et al., "Fully Transparent ZnO Thin-Film Transistor Produced at Room Temperature," *Adv. Mater.*, Vol. 17, No. 5, pp. 590-594 (Mar. 8, 2005).

B. J. Norris et al., "Spin coated zinc oxide transparent transistors," *J. Phys. D: Appl. Phys.*, Vol. 36, pp. L105-L107 (2003).

B. Sun et al., "Solution-Processed Zinc Oxide Field-Effect Transistors Based on Self-Assembly of Colloidal Nanorods," *Nano Lett.*, Vol. 5, No. 12, pp. 2408-2413 (2005)

SUMMARY OF THE DISCLOSURE

There is provided in embodiments a process for fabricating a semiconductor layer of an electronic device comprising: liquid depositing one or more zinc oxide precursor compositions and forming at least one semiconductor layer of the electronic device comprising predominately amorphous zinc oxide from the liquid deposited one or more zinc oxide precursor compositions.

There is also provided in embodiments a process for fabricating a semiconductor layer of an electronic device comprising:

(a) liquid depositing a zinc oxide precursor composition to result in a deposited composition;

(b) heating the deposited composition; and (c) cooling the heated deposited composition, wherein the features (a), (b), and (c) are each accomplished a number of times in any effective arrangement, resulting in at least one semiconductor layer comprising predominately amorphous zinc oxide.

There is provided in additional embodiments a thin film transistor comprising in any effective arrangement:

a semiconductor layer comprising predominately amorphous zinc oxide;

a gate dielectric layer;

a source electrode; and a drain electrode.

BRIEF DESCRIPTION OF THE DRAWINGS

Other aspects of the present invention will become apparent as the following description proceeds and upon reference to the following figures which represent illustrative embodiments.

Unless otherwise noted, the same reference numeral in different Figures refers to the same or similar feature.

DETAILED DESCRIPTION

Figure 1:
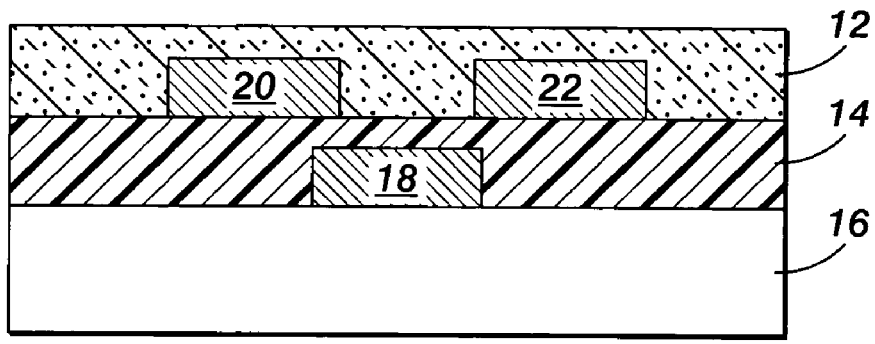
FIG. 1 represents a first embodiment of a TFT made using the present process.

As used herein, room temperature refers to a temperature ranging from about 20 to about 25 degrees C.

In embodiments, the present process for fabricating a semiconductor layer of an electronic device comprises: liquid depositing one or more zinc oxide precursor compositions and forming at least one semiconductor layer of the electronic device comprising predominately amorphous zinc oxide from the liquid deposited one or more zinc oxide precursor compositions. In other embodiments, there is provided an electronic device particularly a thin film transistor comprising a predominately amorphous zinc oxide semiconductor layer.

In embodiments, the zinc oxide in the semiconductor layer is predominantly amorphous. In embodiments, a predominately amorphous zinc oxide semiconductor is preferred over a crystalline zinc oxide semiconductor from the viewpoints of lower processing temperature and uniformity of device characteristics. Suitable techniques such as X-ray diffraction can be used to characterize the amorphous state of the zinc oxide. For example, no or little diffraction peaks are observed at d=2.81, 2.60, 2.48 Å for (100), (002), and (101) plane, respectively, by using Cu Kα radiation ($\lambda$ 1.5418 Å). In embodiments, "predominately amorphous" refers to a crystallinity of less than 50%, or less than about 30%, or less than about 10%. In embodiments, unless otherwise indicated, the term "amorphous" refers to a subset of "predominately amorphous" where the crystallinity of the zinc oxide is less than about 5%.

Any suitable method may be used to determine the crystallinity of the zinc oxide. For example, when X-ray diffraction method is used, an approach to analyzing the measured data is to use Fourier Transform methods to identify and then split the data into the four distinct frequency bands. By looking at the Fourier power spectrum, the various components can be clearly identified. The amorphous and crystalline contributions have clearly defined frequencies within the power spectrum. Once the contributions have been identified in frequency, high and low frequency band pass filters can be introduced into the Fourier transform. The resulting inverse transforms will create the amorphous ($I_A$) and crystalline ($I_C$) diffraction intensities with background and noise removed. The percentage crystallinity is then given by the ratio between these two intensities $I_C/(I_C+I_A)$. In the event of significant variation in results for the various ways to determine crystallinity, the X-ray diffraction method and the procedures described herein for determining crystallinity are preferred.

The present process in embodiments comprises: (a) liquid depositing a zinc-oxide precursor composition to result in a deposited composition; (b) heating the deposited composition; and (c) cooling the heated deposited composition. The features (a), (b), and (c) are each accomplished a number of times in any effective arrangement, resulting in at least one semiconductor layer comprising predominately amorphous zinc oxide. The various features (liquid depositing, heating, and cooling) are each accomplished a suitable number of times such as 1, 2, 3, or more times for each feature. To illustrate the meaning of "any effective arrangement," the following examples are provided of illustrative sequences:

(a)+(b)+(c);
(a)+(a)+(b)+(c);
(a)+(b)+(a)+(b)+(c);
(a)+(b)+(c)+(a)+(b)+(c)+(a)+(b)+(c);
(a)+(b)+(c)+(a)+(b)+(c)+(a)+(b)+(c)+(a)+(b)+(c);
(a)+(b)+(c)+(a)+(b)+(c)+(a)+(b)+(c)+(a)+(b)+(c)+(a)+(b)+(c);
(a)+(b)+(a)+(b)+(a)+(b)+(c);
(a)+(b)+(c)+(a)+(b)+(a)+(b)+(c);
(a)+(b)+(c)+(b)+(c);
(a)+(b)+(c)+(b)+(c)+(b)+(c);
(a)+(b)+(c)+(b)+(c)+(a)+(b)+(c).

The following discussion pertains to embodiments involving multiple occurrences of feature (a), feature (b), and/or feature (c). The zinc oxide precursor composition used in each feature (a) may be the same or different from each other. The heating conditions (e.g., heating temperature profile) in each occurrence of feature (b) may be the same or different from each other. The cooling conditions (e.g., cooling temperature profile) in each occurrence of feature (c) may be the same or different from each other.

The following describes embodiments involving the number of occurrences of particular process sequences. The number of the sequence "(a)+(b)+(c)" is for instance from 1 to 20, from 1 to 10, from 1 to 5, and particularly from 1 to 3. The number of the sequence "(a)+(b)" (that is, additional to the sequence "(a)+(b)+(c)") is for example from 0 to 10, from 0 to 5, and particularly from 0 to 2. The number of the sequence "(b)+(c)" (that is, additional to the sequence "(a)+(b)+(c)") is for instance from 0 to 10, from 0 to 5, and particularly from 0 to 2. The sum of the sequences "(a)+(b)+(c)," "(a)+(b)," and "(b)+(c)" is from 1 to 20, from 1 to about 10, and particularly from 1 to 6.

In embodiments, the zinc oxide precursor composition comprises starting ingredients including a zinc compound and a liquid (which can function in embodiments as a solvent).

The zinc compound is selected for example from the group consisting of zinc acetylacetonate, zinc formate, zinc hexafluoroacetylacetonate, zinc lactate, zinc citrate, zinc oxalate, zinc nitrate, zinc acrylate, zinc methacrylate, their hydrate forms, and the like, and a mixture thereof. In embodiments, the zinc compound is zinc acetylacetonate hydrate. One or more other elements such as aluminum, indium, tin, copper, nickel, lithium, sodium, molybdenum, niobium, titanium, gallium, antimony, selenium, sulfur, boron, etc., can be incorporated by mixing compounds containing these elements with the zinc compound in the zinc oxide-precursor composition. The one or more other elements described above can also be incorporated by using zinc compounds that comprise the one or more other elements such as for example zinc sulfate, zinc sulfite, ethylenediaminetetraacetic acid zinc disodium salt, cobalt/barium/zinc octoate blends, zinc borate, zinc molybdate, zinc niobate, their hydrate forms, and the like, and mixtures thereof. The amount of such other elements in the zinc oxide-precursor composition is for instance about 0.001 mol % to about 50 mol %, from about 0.01 mol % to about 10 mol %, and particularly from 0.1 mol % to about 5 mol %, relative to zinc.

The liquid is selected for example from the group consisting of water, alcohol such as methanol, ethanol, propanol, butanol, pentanol, hexyl alcohol, heptyl alcohol, ethyleneglycol, methoxyethanol, ethoxyethanol, methoxypropanol, ethoxypropanol, methoxybutanol and dimethoxyglycol, formamide such as N,N-dimethylformamide, and the like, and mixtures thereof.

The concentration of the zinc compound in the zinc oxide precursor composition is for example from about 0.01 M to about 5 M (mole per liter), from about 0.02 M to about 2 M, and particularly from about 0.05 M to about 1 M, based on the starting ingredient zinc compound. Chemicals other than the liquid may be used, in embodiments, to help dissolve the zinc compound in the liquid. For example, a chemical which can form a complex with zinc ion may be used. The representative chemical includes ethanolamine, aminopropanol, diethanolamine, 2-methylaminoethanol, N,N-dimethylaminoethanol, methoxyethylamine, methoxypropylamine, diaminoethane, diaminopropane, diaminobutane, diaminocyclohexane, and the like, and mixtures thereof.

The zinc oxide precursor compositions with different types of components or with the same components but different concentrations are herein considered different from each other.

Liquid depositing the zinc oxide precursor composition can be accomplished by any liquid deposition techniques for instance spin coating, dip coating, blade coating, rod coating, screen printing, ink jet printing, stamping and the like. In embodiments, the liquid depositing is ink jet printing.

In embodiments, the deposited composition (that is, resulting from the liquid depositing) may have the same components as the zinc oxide-precursor composition used for the liquid depositing and may or may not differ in concentration of the components (certain liquid deposition techniques possibly may cause some evaporation/removal of the components).

In embodiments, the heating (that is, feature (b)) refers to a heat treatment at a temperature or several temperatures from above room temperature to about 600° C. The heating is accomplished at a maximum temperature for example from above room temperature to about 300° C., particularly from about 40° C. to about 200° C. The heating can be accomplished for example in an instant heating manner at a certain temperature using a pre-heated heating equipment. In embodiments, the heating can be accomplished in a gradual heating manner with a heating rate that the heating equipment can achieve, ranging from for example from about 0.5 to about 100° C. per minute starting from room temperature or starting from a temperature between about 25° C. to about 100° C. In further embodiments, the heating can also be accomplished step-wise at several temperatures, such as, for example, at about 200° C., then at about 300° C., and then at about 500° C. In embodiments, the heating can also be accomplished step-wise at several temperatures including a first temperature and a different second temperature. The first temperature is from above room temperature to about 200° C., and the second temperature is from about 200° C. to about 600° C. In embodiments, the second temperature is achieved with laser heating. With laser heating, temperature-sensitive substrates may be used. Laser heating can be done at selected areas to achieve heating and patterning spontaneously. The step-wise heating at several temperature can be the combination of instant heating and gradual heating, for example, instant heating at about 300° C. for about 30 min, then gradually increase to about 400° C. at a heating rate of about 10° C./min, and then at about 400° C. for about 30 min. The heating can also be accomplished for instance at a higher temperature and then at a lower temperature such as first at about 500° C. and then at about 400° C.

In embodiments, the heating is preferred to be performed at a temperature which is compatible to plastic substrate or at a temperature that does not cause adverse changes in the properties of previously deposited layer(s) or the substrate (whether single layer substrate or multilayer substrate). The heating temperature is for example below about 300° C., or below about 250° C. or below about 200° C.

In embodiments, "cooling" refers to bringing the temperature of the deposited composition to a temperature below about 100° C., and particularly to about room temperature (that is, about 25° C.). The cooling can be accomplished for instance in a self-cooling manner by turning off the heating equipment or in a controlled manner at a certain cooling rate such as for example from about 0.1° C./min to about 100° C./min. In embodiments, a slow cooling such as at a cooling rate of about 0.1° C./min to about 10° C./min may be employed especially from a temperature higher than about 300° C. to reduce mechanical strain in the semiconductor layer(s) and the substrate.

The present zinc oxide semiconductor layer can be used in electronic devices such as solar cell, light emitting diode, and transistors for active matrix displays and signage, and radio-frequency identification (RFID) tags, etc.

In FIG. 1, there is schematically illustrated an TFT configuration 10 comprised of a substrate 16, in contact therewith a metal contact 18 (gate electrode) and a layer of a gate dielectric layer 14 on top of which two metal contacts, source electrode 20 and drain electrode 22, are deposited. Over and between the metal contacts 20 and 22 is a zinc oxide semiconductor layer 12 as illustrated herein.

Figure 2:
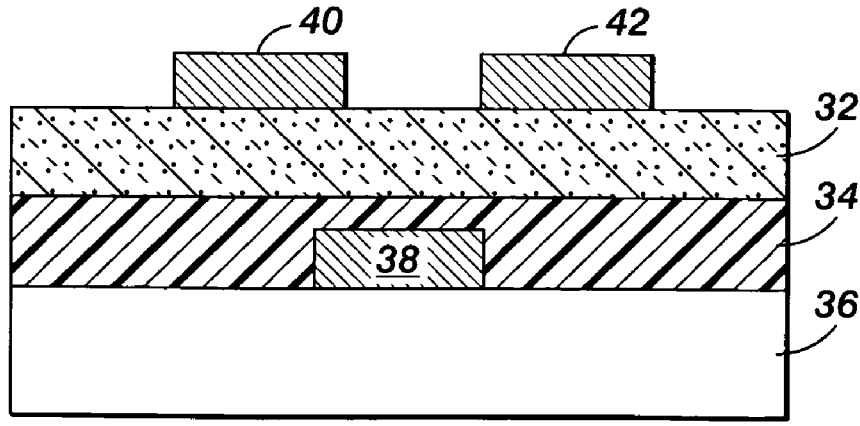
FIG. 2 represents a second embodiment of a TFT made using the present process.

FIG. 2 schematically illustrates another TFT configuration 30 comprised of a substrate 36, a gate electrode 38, a source electrode 40 and a drain electrode 42, a gate dielectric layer 34, and a zinc oxide semiconductor layer 32.

Figure 3:
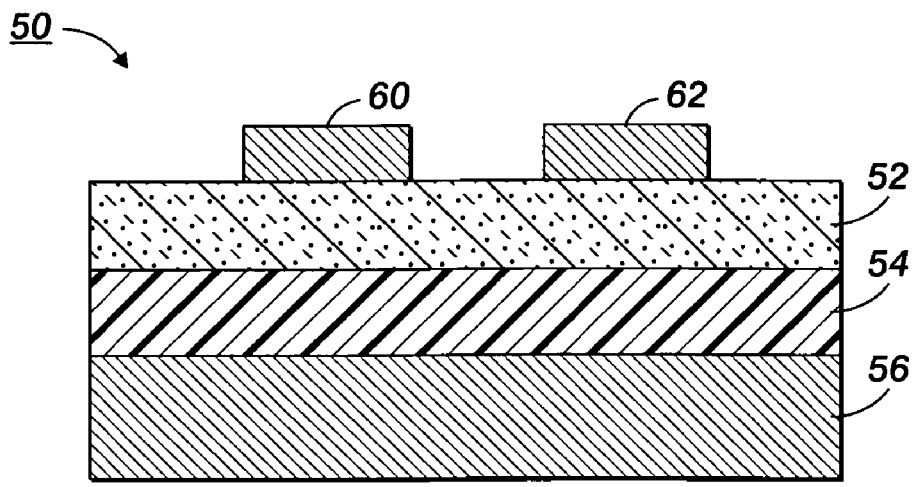
FIG. 3 represents a third embodiment of a TFT made using the present process.

FIG. 3 schematically illustrates a further TFT configuration 50 comprised of a heavily n-doped silicon wafer 56 which acts as both a substrate and a gate electrode, a thermally grown silicon oxide insulating layer 54 as gate dielectric, and a zinc oxide semiconductor layer 52, on top of which are deposited a source electrode 60 and a drain electrode 62.

Figure 4:
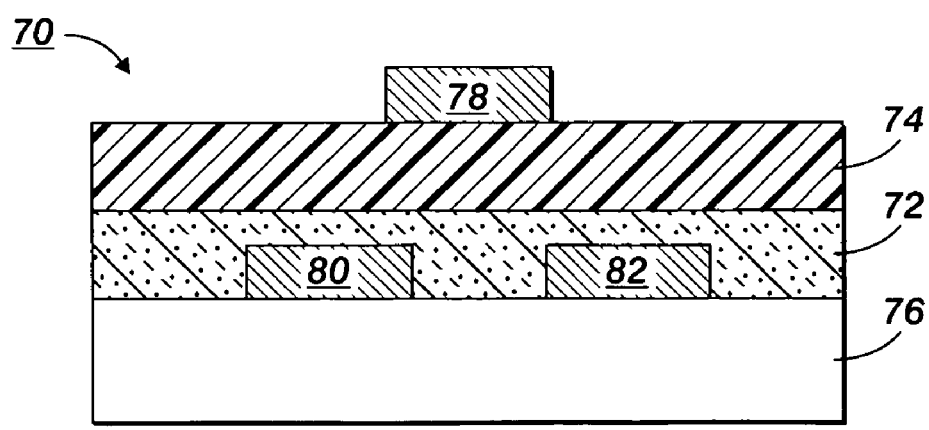
FIG. 4 represents a fourth embodiment of a TFT made using the present process.

FIG. 4 schematically illustrates an additional TFT configuration 70 comprised of substrate 76, a gate electrode 78, a source electrode 80, a drain electrode 82, a zinc oxide semiconductor layer 72, and a gate dielectric layer 74.

Figure 5:
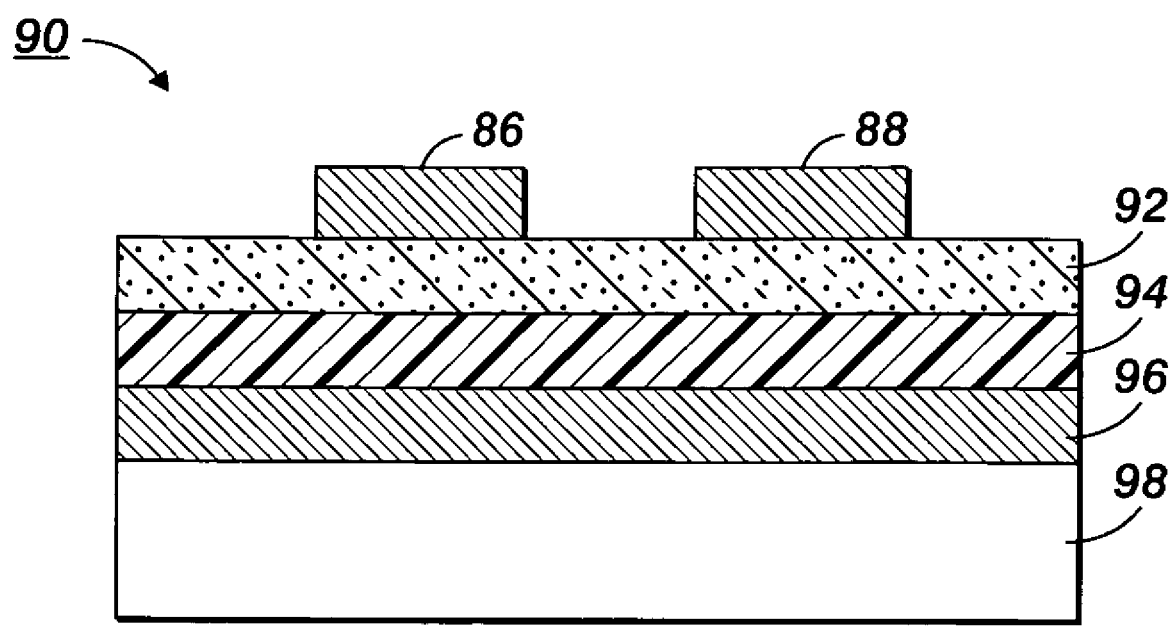
FIG. 5 represents a fifth embodiment of a TFT made using the present process.

FIG. 5 schematically illustrates a further TFT configuration 90 comprised of substrate/indium-tin oxide (ITO)/an aluminum-titanium oxide (ATO), wherein the ITO 96 is a gate electrode on top of the substrate 98, and ATO 94 is a gate dielectric layer, and a zinc oxide semiconductor layer 92, on top of which are deposited a source electrode 86 and a drain electrode 88.

The composition and formation of the zinc oxide semiconductor layer are described herein.

The zinc oxide semiconductor layer has a thickness ranging for example from about 10 nanometers to about 1 micrometer, particularly a thickness of from about 20 to about 200 nanometers. The TFT devices contain a semiconductor channel with a width, W and length, L. The semiconductor channel width may be, for example, from about 1 micrometer to about 5 millimeters, with a specific channel width being about 5 micrometers to about 1 millimeter. The semiconductor channel length may be, for example, from about 1 micrometer to about 1 millimeter with a more specific channel length being from about 5 micrometers to about 100 micrometers.

The substrate may be composed of any suitable materials for instance silicon, glass, aluminum, or plastics. The thickness of the substrate may be from about 10 micrometers to over 10 millimeters with a representative thickness being from about 1 to about 10 millimeters for a rigid substrate such as glass plate or silicon wafer.

The gate electrode can be a thin metal film, a conducting polymer film, a conducting film made from conducting ink or paste or the substrate itself, for example heavily doped silicon. Examples of gate electrode materials include but are not restricted to aluminum, nickel, gold, silver, copper, zinc, indium, zinc-gallium oxide, indium tin oxide, indium-antimony oxide, conducting polymers such as polystyrene sulfonate-doped poly(3,4-ethylenedioxythiophene) (PSS-PEDOT), conducting ink/paste comprised of carbon black/graphite or colloidal silver dispersion in polymer binders, such as ELECTRODAG™ available from Acheson Colloids Company. The gate electrode can be prepared by vacuum evaporation, sputtering of metals or conductive metal oxides, coating from conducting polymer solutions or conducting inks by spin coating, casting or printing. The thickness of the gate electrode ranges for example from about 10 to about 200 nanometers for metal films and in the range of about 1 to about 10 micrometers for polymer conductors.

Typical materials suitable for use as source and drain electrodes include those of the gate electrode materials such as aluminum, zinc, indium, silver, gallium, cadmium, tin, conductive metal oxides such as zinc-gallium oxide, indium-tin oxide, indium-zinc oxide, aluminum-zinc oxide, indium-antimony oxide, conducting polymers and conducting inks. In embodiment, the materials for the source drain electrodes are selected from those materials have doping effect to zinc oxide to increase the conductive of the zinc oxide, for example, aluminum gallium, cadmium, tin, and indium. Typical thicknesses of source and drain electrodes are about, for example, from about 40 nanometers to about 1 micrometer with the more specific thickness being about 100 to about 400 nanometers.

The gate dielectric layer generally can be an inorganic material film or an organic polymer film. Illustrative examples of inorganic materials suitable as the gate dielectric layer include aluminum-titanium oxide, titanium oxide, aluminum oxide, silicon oxide, silicon nitride, barium titanate, barium zirconium titanate and the like; illustrative examples of organic polymers for the gate dielectric layer include polyesters, polycarbonates, poly(vinyl phenol), polyimides, polystyrene, poly(alpha-methylstyrene), poly(methacrylate)s, poly(acrylate)s, epoxy resin, and the like, and mixture thereof. The thickness of the gate dielectric layer is, for example from about 10 nanometers to about 2000 nanometers depending on the dielectric constant of the dielectric material used. A representative thickness of the gate dielectric layer is from about 100 nanometers to about 500 nanometers. The gate dielectric layer may have a conductivity that is for example less than about $10^{-12}$ S/cm.

In embodiments, the gate dielectric layer, the gate electrode, the semiconductor layer, the source electrode, and the drain electrode are formed in any sequence with the gate electrode and the semiconductor layer both contacting the gate dielectric layer, and the source electrode and the drain electrode both contacting the semiconductor layer. The phrase "in any sequence" includes sequential and simultaneous formation. For example, the source electrode and the drain electrode can be formed simultaneously or sequentially.

For a n-channel TFT, the source electrode is grounded and a bias voltage of generally, for example, about 0 volt to about 80 volts is applied to the drain electrode to collect the charge carriers transported across the semiconductor channel when a voltage of generally about −20 volts to about +80 volts is applied to the gate electrode.

The invention will now be described in detail with respect to specific representative embodiments thereof, it being understood that these examples are intended to be illustrative only and the invention is not intended to be limited to the materials, conditions, or process parameters recited herein. All percentages and parts are by weight unless otherwise indicated.

EXAMPLE 1

A TFT device having the configuration of FIG. 3 was prepared as the follows. n-Doped silicon wafer with a thermally grown silicon oxide (100 nm) was used as the substrate. The wafer functioned as the gate electrode while the silicon oxide layer, the gate dielectric which has a capacitance of 32 nF/cm$^2$ as measured with a capacitor meter. The wafer was first rinsed with isoproponal, subject to argon plasma cleaning, and then rinsing with isoproponal again. A hot solution of 30 mg zinc acetylacetonate in 1 ml isopropanol was spin coated on the cleaned silicon at 1000 rpm for 50 seconds. The resulting film was heated at 160° C. for 10 min. Subsequently the spin coating and heating processes were repeated for 3 more times. Finally, the resulting semiconductor thin-film layer was heated at 200° C. for 1 hour. A series of gold source-drain electrode pairs were vapor-deposited on top of the semiconductor layer through a shadow mask, thus forming a set of TFTs with various dimensions.

The devices were evaluated using Keithley 4200 TFT characterization system at ambient conditions. The field-effect mobility in the saturated regime, μ, was calculated according to equation (1)

$$I_{SD} = C_i \mu (W/2L)(V_G - V_T)^2 \quad (1)$$

where $I_{SD}$=drain current at the saturated regime, W and L are respectively channel width and length, $C_i$ is the capacitance per unit area of the gate dielectric layer, and $V_G$ and $V_T$ are respectively gate voltage and threshold voltage. The transfer and output characteristics of the devices showed that ZnO was an n-type semiconductor. Using transistors with a dimension of W=5,000 μm and L=90 μm, the following properties were obtained: Mobility: 0.004 cm$^2$/V.s and current on/off ratio: 10$^5$.

X-ray diffraction was conducted on the zinc oxide semiconductor layer at room temperature on a Rigaku MiniFlex Diffractometer using Cu Kα radiation (λ 1.5418 Å) with a θ-2θ scans configuration. No diffraction peak was detected at d=2.81, 2.60, 2.48 Å, indicating an "amorphous" characteristic.

EXAMPLE 2

A TFT device having the configuration of FIG. 5 was prepared as the follows. A glass substrate coated with an indium-tin oxide (ITO) layer (gate) and an aluminum-tin oxide (ATO, 220 nm) top layer (gate dielectric) was used. The capacitance was measured to be 70 nF/cm$^2$. Zinc oxide semiconductor layer was prepared in the same manner as described in Example 1. The devices were completed by vacuum evaporation of gold source and drain electrodes, and characterized as the above. Using transistors with a dimension of W=5,000 μm and L=90 μm, the following properties were obtained: Mobility: 0.008 cm$^2$/V.s and current on/off ratio: 10$^5$-10$^6$.

It will be appreciated that various of the above-disclosed and other features and functions, or alternatives thereof, may be desirably combined into many other different systems or applications. Various presently unforeseen or unanticipated alternatives, modifications, variations or improvements therein may be subsequently made by those skilled in the art which are also intended to be encompassed by the following claims. Unless specifically recited in a claim, steps or components of claims should not be implied or imported from the specification or any other claims as to any particular order, number, position, size, shape, angle, color, or material.

The invention claimed is:

1. A process for fabricating a semiconductor layer of an electronic device comprising:
   (a) liquid depositing a first mixture comprising a zinc oxide precursor composition;
   (b) heating the deposited first mixture to a maximum temperature of from about 20 degrees C. to below about 300 degrees C. to form predominately amorphous zinc oxide from the first mixture;
   (c) cooling the deposited first mixture;
   (d) liquid depositing a second mixture comprising a zinc oxide precursor composition upon the predominately amorphous zinc oxide formed from the first mixture;
   (e) heating the deposited second mixture to a maximum temperature of from about 20 degrees C. to below about 300 degrees C. to form predominately amorphous zinc oxide from the second mixture; and
   (f) cooling the deposited second mixture,
   wherein the first mixture and the second mixture are different, to form at least one semiconductor layer of the electronic device.

2. The process of claim 1, wherein the first mixture comprises starting ingredients including a zinc compound and a liquid.

3. The process of claim 2, wherein the liquid is selected from the group consisting of water, methanol, ethanol, propanol, butanol, ethyleneglycol, methoxyethanol, ethoxyethanol, methoxypropanol, ethoxypropanol, methoxybutanol, dimethoxyglycol, N,N-dimethylformamide, and a mixture thereof.

4. The process of claim 2, wherein the zinc compound is selected from the group consisting of zinc acetylacetonate, zinc formate, zinc hexafluoroacetylacetonate, zinc lactate, zinc citrate, zinc oxalate, zinc nitrate, zinc acrylate, zinc methacrylate, their hydrate forms, and a mixture thereof.

5. The process of claim 1, wherein the first mixture is a single precursor composition consisting of zinc acetylacetonate hydrate and an alcohol.

6. The process of claim 1, wherein the electronic device comprises a plastic substrate.

7. A process for fabricating a semiconductor layer of an electronic device comprising:
   (a) liquid depositing a zinc oxide precursor composition to result in a deposited composition;
   (b) heating the deposited composition to a maximum temperature of from about 20 degrees C. to about 300 degrees C. to form a predominately amorphous zinc oxide sublayer; and
   (c) cooling the heated deposited composition;
   (d) liquid depositing the zinc oxide precursor composition upon the previously deposited predominately amorphous zinc oxide sublayer;
   (e) heating the deposited composition to a maximum temperature of from about 20 degrees C. to about 300 degrees C. to form another predominately amorphous zinc oxide sublayer;

and (f) cooling the deposited composition; wherein the steps (d), (e), and (f) are each accomplished a number of times in any effective arrangement, resulting in the formation of a semiconductor layer formed from multiple predominately amorphous zinc oxide sublayers;

wherein (d) and (e) are consecutively repeated in sequence from 1 to 9 times; andwherein the zinc oxide precursor composition comprises a zinc compound selected from the group consisting of zinc hexafluoroacetylacetonate, zinc lactate, zinc citrate, zinc oxalate, zinc acrylate, zinc methacrylate, zinc sulfate, zinc sulfite, ethylenediaminetetraacetic acid zinc disodium salt, cobalt/barium/zinc octoate blends, zinc borate, zinc molybdate, zinc niobate, their hydrate forms, or a mixture thereof.

8. The process of claim 7, wherein the heating is accomplished at a maximum temperature from about 40 to about 200 degrees C.

9. The process of claim 7, wherein the electronic device is a thin film transistor.

10. The process of claim 7, wherein the zinc oxide precursor composition comprises starting ingredients including the zinc compound and a liquid.

11. The process of claim 10, wherein the liquid is selected from the group consisting of water, methanol, ethanol, propanol, butanol, ethyleneglycol, methoxyethanol, ethoxyethanol, methoxypropanol, ethoxypropanol, methoxybutanol, dimethoxyglycol, N,N-dimethylformamide, and a mixture thereof.

12. The process of claim 10, wherein the zinc compound is selected from the group consisting of zinc hexafluoroacetylacetonate, zinc lactate, zinc citrate, zinc oxalate, zinc acrylate, zinc methacrylate, their hydrate forms, and a mixture thereof.

13. The process of claim 7, wherein the heating comprises step-wise heating at several temperatures including a first temperature at above about 20 degrees C. to about 200 degrees C. and a different second temperature.

14. The process of claim 13, wherein the second temperature is accomplished by laser heating.

15. The process of claim 7, wherein the electronic device comprises a plastic substrate.

* * * * *

UNITED STATES PATENT AND TRADEMARK OFFICE
CERTIFICATE OF CORRECTION

PATENT NO. : 8,222,076 B2
APPLICATION NO. : 11/498031
DATED : July 17, 2012
INVENTOR(S) : Yiliang Wu et al.

Page 1 of 1

It is certified that error appears in the above-identified patent and that said Letters Patent is hereby corrected as shown below:

In the Specifications:

Column 1, line 12, please insert --STATEMENT REGARDING FEDERALLY SPONSORED RESEARCH OR DEVELOPMENT This invention was made with United States Government support under Cooperative Agreement No. 70NANB0H3033 awarded by the National Institute of Standards and Technology (NIST). The United States Government has certain rights in the invention.-- as a separate paragraph before the heading "BACKGROUND OF THE INVENTION".

Signed and Sealed this
Third Day of September, 2013

Teresa Stanek Rea
*Acting Director of the United States Patent and Trademark Office*

UNITED STATES PATENT AND TRADEMARK OFFICE
CERTIFICATE OF CORRECTION

PATENT NO. : 8,222,076 B2
APPLICATION NO. : 11/498031
DATED : July 17, 2012
INVENTOR(S) : Yiliang Wu et al.

It is certified that error appears in the above-identified patent and that said Letters Patent is hereby corrected as shown below:

Title Page, Item (74): "Fay Sharpe LLP" should be changed to "Zosan S. Soong; Fay Sharpe LLP".

Signed and Sealed this
Twenty-ninth Day of October, 2013

Teresa Stanek Rea
*Deputy Director of the United States Patent and Trademark Office*